United States Patent [19]
Smith et al.

[11] Patent Number: 5,287,619
[45] Date of Patent: Feb. 22, 1994

[54] METHOD OF MANUFACTURE MULTICHIP MODULE SUBSTRATE

[75] Inventors: W. David Smith, Abington; John A. Olenick, Thompson; Carlos L. Barton, Brooklyn; Jane L. Cercena, Ashford; Daniel J. Navarro, Putnam; Kathleen R. Olenick, Thompson; Angela M. Kneeland; Thomas S. Kneeland, both of Putnam, all of Conn.; Mark F. Sylvester, Pawtucket, R.I.; Curtis H. Kempton, Mesa, Ariz.; Scott E. Derosier, Rogers, Conn.; Lynn E. Burdick, Hampton, Conn.; Richard T. Traskos, Brooklyn, Conn.; Robert B. Huntington, Tempe, Ariz.; James S. Rivers, Ballouville, Conn.; Samuel Gazit, West Hartford, Conn.; Jeffrey B. Ott, Brooklyn, Conn.; William P. Harper, Tempe, Ariz.

[73] Assignee: Rogers Corporation, Rogers, Conn.

[21] Appl. No.: 847,895

[22] Filed: Mar. 9, 1992

[51] Int. Cl.⁵ .............................................. H01K 3/10
[52] U.S. Cl. ..................................... 29/852; 156/630; 156/659.1; 156/901; 156/902; 427/97; 428/901
[58] Field of Search ................ 428/901; 156/901, 902, 156/659.1, 630; 29/852

[56] References Cited

U.S. PATENT DOCUMENTS

| | | |
|---|---|---|
| 4,159,222 | 6/1979 | Lebow et al. |
| 4,306,925 | 12/1981 | Lebow et al. |
| 4,446,477 | 5/1984 | Currie et al. |
| 4,640,866 | 2/1987 | Suzuki ............................ 428/901 X |
| 4,667,220 | 5/1987 | Lee et al. |
| 4,692,839 | 9/1987 | Lee et al. |
| 4,702,792 | 10/1987 | Chow et al. |
| 4,755,911 | 7/1988 | Suzuki ............................ 428/901 X |
| 4,810,332 | 3/1989 | Pan |
| 4,816,323 | 3/1989 | Inoue |
| 4,849,284 | 7/1989 | Arthur et al. |
| 4,874,721 | 10/1989 | Kimura et al. |
| 4,915,983 | 4/1990 | Lake et al. ........................ 427/97 X |

(List continued on next page.)

FOREIGN PATENT DOCUMENTS

0426496A2  2/1990  European Pat. Off.

OTHER PUBLICATIONS

"IBM's SLC The Potential Threat to Mechanically Drilled Holes", 1991, BPA (Technology & Management) Ltd.

Richard T. Traskos, W. David Smith and Steven C. Lockard "Continuing Development of Fluoropolymer Composite Multichip Modules". Jun. 1990, Proceedings of Nepcon East.

Richard T. Traskos, Steven C. Lockard, "Fluoropoly- (List continued on next page.)

Primary Examiner—Carl J. Arbes
Attorney, Agent, or Firm—Fishman, Dionne & Cantor

[57] ABSTRACT

In accordance with the present invention, an MCM substrate product is manufactured in an additive process using multiple layers of a fluoropolymer composite material and copper. The copper layers are plated, and the fluoropolymer composite layers are laminated. A seeding process promotes reliable bonding between the fluoropolymer composite material and the plated copper. The use of the filled fluoropolymeric composite eliminates the need for a barrier metal layer between the insulation and the conductors. The MCM substrate device of the present invention may have multiple metal layers and multiple dielectric layers; four or five, or more, of each in a single structure would be easily achieved and is typical. The structure would include lead lines in separate mutually orthogonal planes (sometimes referred to as "x" and "y" lead lines) sandwiched between ground and power voltage planes of copper. The MCM substrate device of the present invention also has solid copper vias, which may be used either as electrical interconnection between layers of the MCM substrate and/or to the I/C's to be packaged in the module, or as thermal vias for heat conduction for thermal management. The manufacturing process of the present invention makes it possible to start or stop any via in any layer of the device.

21 Claims, 8 Drawing Sheets

U.S. PATENT DOCUMENTS

| | | |
|---|---|---|
| 4,922,377 | 5/1990 | Matsumoto et al. . |
| 4,926,241 | 5/1990 | Carey . |
| 4,958,258 | 9/1990 | Charruau . |
| 4,995,941 | 2/1991 | Nelson et al. . |
| 5,010,641 | 4/1991 | Sisler ........................ 428/901 X |
| 5,011,580 | 4/1991 | Pan et al. . |
| 5,023,921 | 6/1991 | Goutte et al. . |
| 5,049,974 | 9/1991 | Nelson et al. . |
| 5,055,425 | 10/1991 | Leibovitz et al. . |
| 5,061,548 | 10/1991 | Arthur et al. . |
| 5,129,142 | 7/1992 | Bindra et al. ....................... 29/852 |

OTHER PUBLICATIONS mer Composite Multichip Modules" Sep. 1989; International Electronics Packaging Conf.

John A. Olenick, Sam Gazit, Mark F. Sylvester, Robert S. Huntington, "Thermomechanical Modeling of Multichip Modules" Oct. 1990, Proceedings of the 1990 Symposium of Microelectronics.

John A. Olenick and Mark F. Sylvester, "Thermal Management in Fluoropolymer Composite Multichip Modules", Oct. 1991, Proceedings of the 1991 International Symposium of Microelectronics.

Bill Blood and Allison Casey, "Evaluating Multichip Module Packaging Technology", Jul., 1991, Technology.

J. Tony Pan, Steven Poon and Brad Nelson, "A Planar Approach to High Density Cooperpolyimide Interconnect Fabrication", 1988, International Electronics Packaging & Production Conf.

J. Tony Pan and Stephen Poon, "High Density Multi--Level Copper Polyimide Interconnects", Nov. 1989, IPC Technical Review.

Peter Dunbeck, "Digital's Multichip Unit: The Performance Packaging Answer", Aug. 23, 1990, Electronic Design.

Takaaki Ohsaki, Toyoshi Yasuda, Satoru Yamaguchi and Taichi Kon, "A Fine-Line Multilayer Substrate with Photo-Sensitive Polyimide Dielectric and Electroless Copper Plated Conductors", NTT Electrical Comm. Lab.

"MCMs Accommodate Multiple Via Structures", Apr. 1991, Hybrid Circuit Technology.

"Japanese Packaging and Interconnect Technology Overview", 1990, Microelectronics and Computer Technology Corporation.

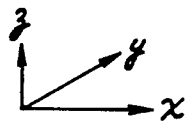
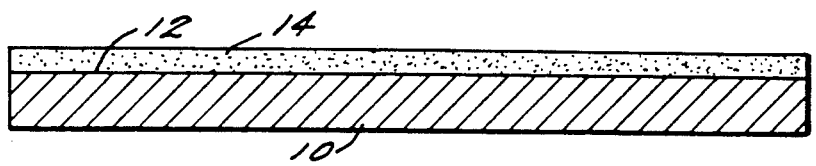
FIG. 1
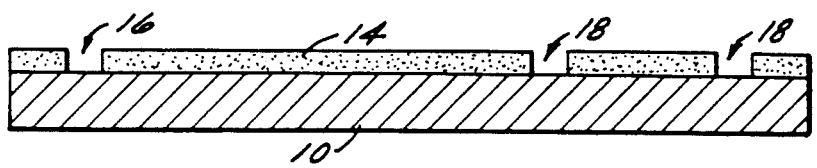
FIG. 2
FIG. 3
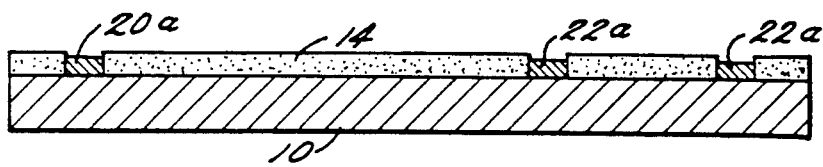
FIG. 4
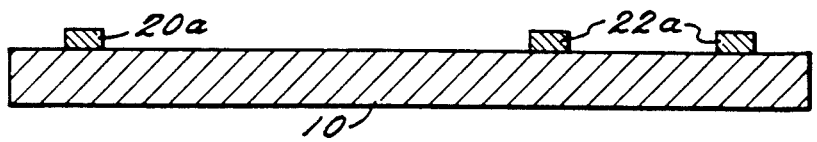
FIG. 5
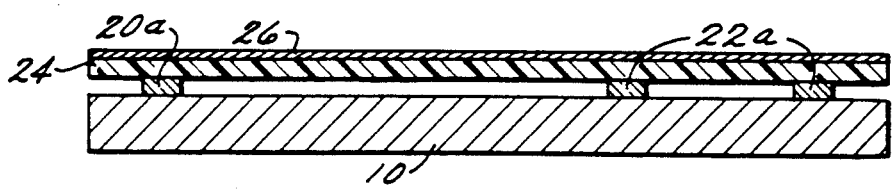
FIG. 6
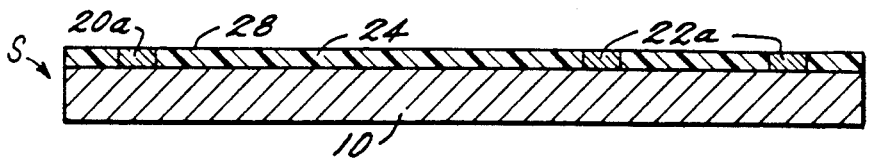
FIG. 7
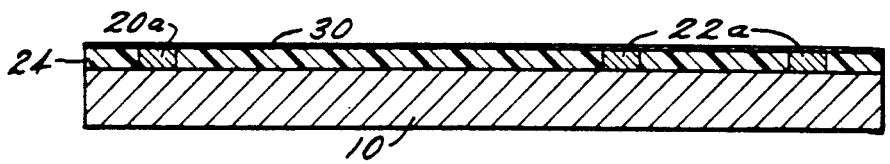
FIG. 8

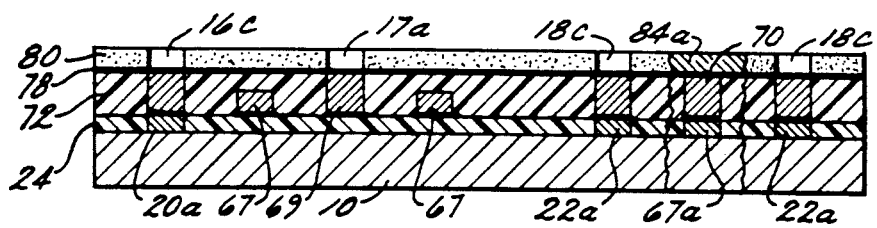
FIG. 16
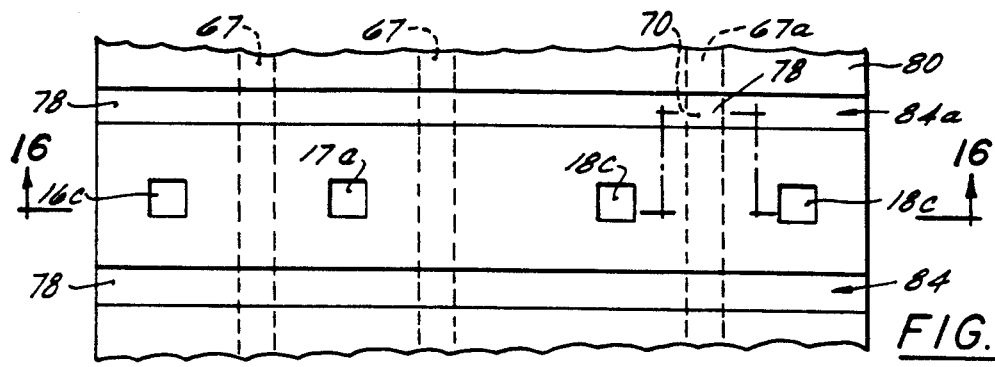
FIG. 16A
FIG. 17
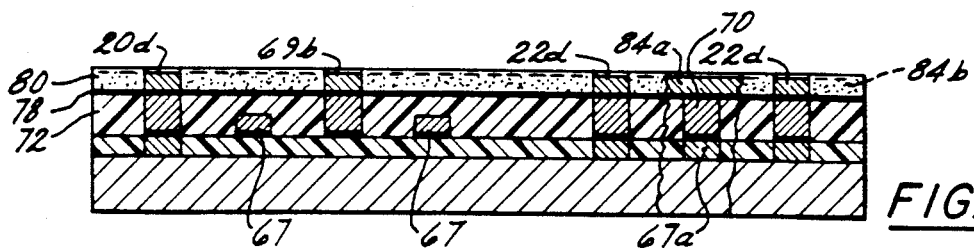
FIG. 17A
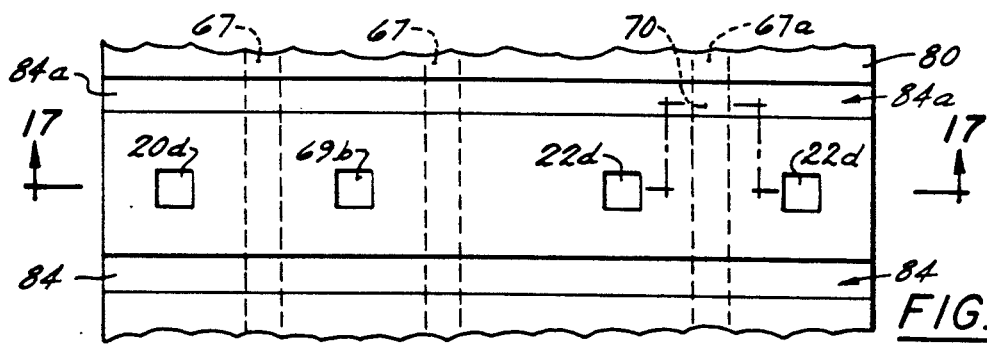
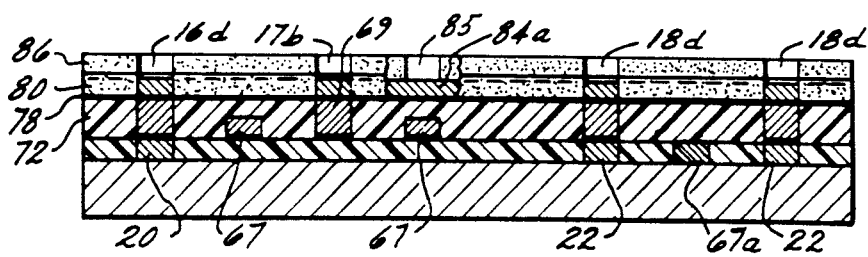
FIG. 18

| | | | |
|---|---|---|---|
| A | select platform | X | define via passage sites |
| B | define via sites | Y | plate power plane and via continuations |
| C | plate vias | Z | define via continuation sites |
| D | remove photoresist | AA | plate via continuations |
| E | place and laminate fluoropolymer | BB | remove resist and flash etch |
| F | planarize/flycut | CC | place and laminate fluoropolymer |
| G | sputter seed layer | DD | planarize/flycut |
| H | define "y" line and via sites | EE | sputter seed layer |
| I | plate "y" lines and vias | FF | define pad sites |
| J | define continuation and blind via sites | GG | plate pad sites |
| K | plate continuation and blind vias | HH | remove resist and flash etch |
| L | remove resist and flash etch | | OR |
| M | place and laminate fluoropolymer | CC' | apply rigid top layer |
| N | planarize/flycut | DD' | planarize/flycut |
| O | sputter seed layer | EE' | sputter seed layer |
| P | define "x" line and via sites | FF' | define pad sites |
| Q | plate "x" line and via extensions | GG' | plate pad sites |
| R | define via continuation sites | HH' | remove resist and flash etch |
| S | plate via continuations | | |
| T | remove resist and flash etch | | |
| U | place and laminate fluoropolymer | | |
| V | planarize/flycut | | |
| W | sputter seed layer | | |

FIG. 36

METHOD OF MANUFACTURE MULTICHIP MODULE SUBSTRATE

BACKGROUND OF THE INVENTION

This invention relates to the field of multilayer high density interconnect devices, sometimes referred to as multichip modules (MCM). More particularly, this invention relates to the manufacture of substrates for MCM's, and the resulting MCM substrate product, in a process using a thermoplastic fluoropolymer composite material, additive copper plating, insulation lamination, planarization, sputter deposition of copper seed layers and where required, formation of a rigid top layer.

The need for and desireability of substrates for MCM's is well known in the electronic industry. The need for increased density in I/C packaging, increased interconnection capacity, and improved interconnection performance is well known among those involved in VLSI packaging and elsewhere in the electronics industry.

A multichip module can be viewed as a packaging technique in which several I/C chips, which may include complex microprocessor chips, memory chips, etc., are interconnected by a high density substrate. Although substrates for MCM's have been known in general for several years, these known prior art substrates for MCM's typically use thin film polyimide based material systems, and those systems have known deficiencies. Polyimide dielectric materials suffer from poor thermo-mechanical reliability and stability and electrical performance limitations. The polyimide materials are thermosetting, and have high elastic modulus, and there is a significant mismatch, i.e., difference, between the coefficient of thermal expansion (CTE) of the polyimide and the copper-conductors. That all results in high stresses in the polyimide material and in surrounding materials and interfaces during thermal excursions in either or both the manufacturing process for or during use of the MCM substrate. Those stresses can lead to dimensional instabilities, cracking, delamination and other thermo-mechanically related problems. Also, the chemical bond between the polyimide and the copper conductors is weak and sensitive to the presence of water, thus leading to poor reliability of the copper-polyimide interface.

In some manufacturing processes for polyimide-based substrates for MCM's, a liquid form polyimide precursor is applied and then cured; in other processes, a sheet form polyimide prepreg is used. In either case, it is difficult to keep water out of the MCM substrate structure made with polyimides. Water is generated during the polyimide cure, and the polyimide equilibrium water absorption is substantial, often in excess of 1%, and the rate of water uptake can be high. Also, water diffusion rates in polyimides are often high, so any water in a polyimide MCM substrate structure can diffuse quickly to the polyimide-conductor interface to corrode or otherwise degrade the interface. To combat this interface problem, a layer of metal, usually chromium is used as a barrier layer between the polyimide and the copper conductors. While this use of a barrier layer can be successful, it adds significant and expensive processing steps and costs to the manufacture of the MCM substrate structure.

Another point to note about polyimide based substrates for MCM's is that they are thin film structures. The layers of polyimide are typically in the range of 5 to 12 microns in thickness, with conductor line thickness in the range of 2 to 7 microns. Those relatively thin conductor lines mean relatively high resistance and relatively high loss; and both the nature of the polyimide material, per se, and the relatively thin layers used, result in poor electrical insulation characteristics.

SUMMARY OF THE INVENTION

The above discussed problems of the prior art are overcome or alleviated by the process of multichip module manufacture, and the resulting MCM substrate, of the present invention.

In accordance with the present invention, an MCM substrate product is manufactured in an additive process using multiple layers of a fluoropolymer composite material and copper. The copper layers are plated, and the fluoropolymer composite layers are laminated. A seeding process promotes reliable bonding between the fluoropolymer composite material and the plated copper. The use of the filled fluoropolymer composite eliminates the need for a barrier layer between the insulation and the conductors.

The fluoropolymer composite dielectric material used in the MCM substrate of the present invention is preferably the material known as R02800, available from Rogers Corporation, Rogers, Conn., the assignee of the present invention. That material is a thermoplastic polytetrafluoroethylene material with silane coated ceramic filler. That fluoropolymer material is set forth in more detail in commonly assigned U.S. Pat. Nos. 4,849,284 and 5,061,548, the entire contents of which are incorporated herein by reference. The thermoplastic nature of the material combined with a high filler content (preferably greater than 50 vol. % and most preferably greater than 60 vol. %) imparts a high viscosity at the melt temperature. Therefore, the material can be repeatedly remelted without losing dimensional stability during sequential manufacturing steps. Also, the dielectric material has a low modulus of elasticity (100-120 Kpsi) and a low CTE, thus resulting in low stress both during the manufacturing process and in the use of the resulting MCM substrate structure. Also, the material is characterized by low moisture absorption on the order of less 0.13%.

The electrical conductors of the MCM substrate of the present invention are copper strips formed by a two step process of (1) forming an adherent thin seed layer of copper on the fluoropolymer material by a sputtering process, and (2) electrodeposition of a thicker layer of copper. The sputtering process to form the adherent thin seed layer of copper on the fluoropolymer material is an important aspect of the present invention. The line width of the copper conductors is typically 2 mils, with line spacing typically being 3 mils. The copper line thickness can be from 0.5 to 1.0 mil, which is thick; so these lines have low resistance and result in very low loss compared to very thin lines of other MCM substrate constructions.

The MCM substrate device of the present invention may have multiple metal layers and multiple dielectric layers; four or five, or more, of each in a single structure would be easily achieved and is typical. The structure would include lead lines in separate mutually orthogonal planes (sometimes referred to as "x" and "y" lead lines) sandwiched between ground and power voltage planes of copper.

The MCM substrate device of the present invention also has solid copper vias, which may be used either as electrical interconnection between layers of the MCM substrate and/or to the I/C's to be packaged in the module, or as thermal vias for heat conduction for thermal management. The manufacturing process of the present invention makes it possible to start or stop any via in any layer of the device. The vias may be blind, i.e., entirely internal of the device (such as to interconnect an "x" line to a "y" line); or the vias may go from a surface of the MCM substrate structure to any signal line or to a ground plane or a voltage plane; or the vias may be thermal columns extending completely through the MCM substrate structure to transfer heat away from the I/C's for thermal management. The vias can be padless; i.e., the via and line widths can be the same, thereby conserving space. The thermal vias are solid posts through the MCM substrate structure, and they may range in size down to two mil square in cross section. The electrical vias may also range in size down to two mil with an aspect ratio of about 1; and the electrical vias may be straight or staggered in cross section from the top to the bottom of the MCM substrate.

Further in accordance with the present invention, the uppermost layer of the MCM substrate structure (on which the I/C's would be mounted) may be rigidized to improve wire bonding and handling capabilities and characteristics of the MCM substrate structure. The rigidized upper layer is in place of a fluoropolymer layer; and preferably the rigidized upper layer is a cyanate ester/silica layer.

Other features and advantages of the present invention will be understood by those skilled in the art from the following detailed description and drawings.

BRIEF DESCRIPTION OF THE DRAWINGS

Referring now to the drawings, wherein like elements are numbered alike in the several FIGURES:

FIGS. 1-34 show various stages in the process of manufacture of the MCM substrate of the present invention.

FIG. 36 is a flow chart showing the manufacturing process of the present invention.

Figure 9:
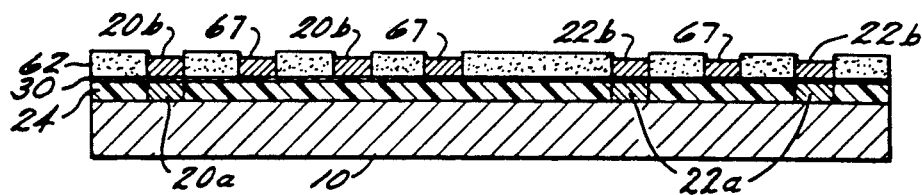

It will be understood that FIGS. 1 through 34 show part of an MCM substrate assembly in its process of manufacture. In these drawings, only one, or a few, of each type of via, lead lines and voltage planes is shown for purposes of illustration. It will, however, be understood that the number and type of lead lines, vias and voltage planes will be determined by the specific design and function of any particular MCM substrate.

DESCRIPTION OF THE PREFERRED EMBODIMENT

Referring to FIG. 1, the process of the present invention starts with a flat platform 10 on which the MCM substrate is to be built, and which may form a part of the finished MCM substrate structure. The copper surface of platform 10, on which the MCM substrate is to be built, must be as flat as possible. Platform 10 can be a copper sheet, preferably of 20 mil thick copper alloy 7025 with parallel flat opposed top and bottom surfaces. The platform could also be other material that is dimensionally stable in the x (horizontally in the plane of the drawing paper), y (into the plane of the paper), and z (vertically along the plane of the paper) directions; is at least as hard as copper; and has a CTE approximately equal to or slightly less than that of copper. Platform 10 could also be a flat, rigid ceramic element, either featureless or cofired. A first embodiment of the invention will be described with a platform of 20 mil thick copper having flat and parallel top and bottom surfaces. In this first embodiment, platform 10 serves not only as the platform on which the MCM substrate structure is built, but it also remains in the final product and serves as both a ground plane and as a heat sink for thermal management. A second embodiment with a ceramic platform will be discussed later.

The flat upper surface 12 of platform 10 is coated with a photoresist material 14, preferably a dry film photoresist about 2 or 3 mils thick. Photoresist 14 is then imaged and developed to define a via site 16 for a first voltage (ground) via and via sites 18 for thermal vias. See FIG. 2. The selection of platform 10 and the definition of the via sites 16 and 18 are shown as steps A and B of FIG. 36.

Next, ground via segment 20(a) and thermal via segments 22(a) are formed by electroplating copper on base 10 in sites 16, 18. The plating is controlled so that the height of vias 20(a) and 22(a) is equal to or less than the height of photoresist 14. Care must be taken that the electroplated vias do not mushroom over above the surface of the photoresist. See FIG. 3 and step C of FIG. 36. After the vias 20(a) and 22(a) have been plated, photoresist 14 is removed to leave via segments 20(a) and 22(a) standing on platform 10. Any residual photoresist is removed preferably using an argon/oxygen plasma etch. It will be appreciated that this etching step is used throughout the method of the present invention to remove residual photoresist. See FIG. 4 and step D of FIG. 36.

Next, a layer 24 of the RO2800 fluoropolymer material is placed on top of the vias (see FIG. 5). Fluoropolymer layer 24 may be from 5-10 mils thick, preferably 10 mils thick. The fluoropolymer material has a thin (e.g., 1 mil) top layer 26 of copper which serves as a release layer for a subsequent laminating step. The fluoropolymer layer 24 is then laminated to platform 10 by a heat and pressure lamination process. In this lamination process, release layer 26 prevents fluoropolymer layer 24 from sticking to a press pad (which in turn, is in contact with the press platen). The lamination process densifies the fluoropolymer layer in the z direction. However, the material is a highly filled and viscous polymer which does not flow laterally (x or y directions) under heat and pressure. Thus, the positioning and alignment of the vias is not disturbed by lateral flow of the fluoropolymer 24 during the lamination step. Placing the fluoropolymer and laminating it to form a laminated subassembly are shown in step E in FIG. 36.

The preferred process for effecting the lamination is as follows:
(a) Place the assembly (platform, vias, fluoropolymer layer) in the press, close the press and apply a low pressure (about 100 p.s.i.) as heat is applied;
(b) ramp the temperature up to 700° F.;
(c) increase the pressure to 1700 p.s.i.;
(d) soak at 700° F. and 1700 p.s.i. for one hour;
(e) while maintaining 1700 p.s.i., reduce temperature to 400° F.;

(f) at 400° F., reduce the pressure to 100 p.s.i.;
(g) cool to below 100° F. (or room temperature) at 1000 p.s.i.;
(h) remove the assembly from the press.

After the laminated subassembly is removed from the press, copper release layer 26 is removed by etching. Platform 10 is protected from the etch during this etching step by, e.g., being coated with a photoresist which is removed after all etching steps in the MCM substrate manufacturing process are completed.

Next, the upper surface of the assembly is planarized by flycutting to (a) ensure planarity (i.e., parallelism) with the upper surface 12 of platform 10, and (b) to provide an upper surface 28 of the assembly where the vias 20(a) and 22(a) are exposed and are coplanar with each other and with the exposed upper surface 28 of laminated fluoropolymer layer 24. The planarizing step is indicated as step F in FIG. 36; and the planarized unit is shown in FIG. 6.

The flycutting is done with a Rank-Pneumo model MSG 500 flycutter. This is an air-bearing, vertical mount spindle flycutter with an air bearing table slide. The machine has an aluminum vacuum chuck which is adhered to the machine table slide. The chuck is fly cut to establish a reference plane known to be flat and parallel to the machine slide. The laminated subassembly is placed on the chuck (with the fluoropolymer layer 24 facing upwards) and secured to the chuck by drawing a vacuum through the chuck. The cutting tool is then located over the subassembly at a position close to but not touching the subassembly. The cutting tool is then moved over the surface of the subassembly while the chuck is indexed in height (i.e. the z direction) in 0.0001" increments until a scratch is seen on the surface of the vacuum chuck. Then, the chuck is raised to the desired height to achieve the target thickness of the planarized subassembly. The maximum amount of material to be removed in any one pass is 0.003". If more than 0.003" is to be removed, multiple passes are made, the flycutting machine operates at a spindle speed of 2250 rpm and 3 inches/minute table feed rate. The subassembly is then removed from the flycutting machine and cleaned with a freon degreasing material.

A monocrystaline diamond cutting tool is used for the flycutting, and the cutting tool must be operated at a positive rake angle, preferably about 4°. The use of a positive rake angle is important because it minimizes disruption of coplanar vias during flycutting.

After the flycutting step, a seed layer of copper 30 is sputter coated on the planarized surface 28 to provide a seed layer of copper on both the fluoropolymer and the vias for further electroplating. The seed layer is very thin, about 1 micron or less, and it is an important step in the manufacturing process in that it ensures good bonding of a subsequently plated copper layer to the fluoropolymer. The sputtering step to form the seed layer is indicated at step G of FIG. 36, and the subassembly with the seed layer is shown in FIG. 7 (although it will be understood that the seed layer is actually much thinner than shown in FIG. 7).

Figure 35:
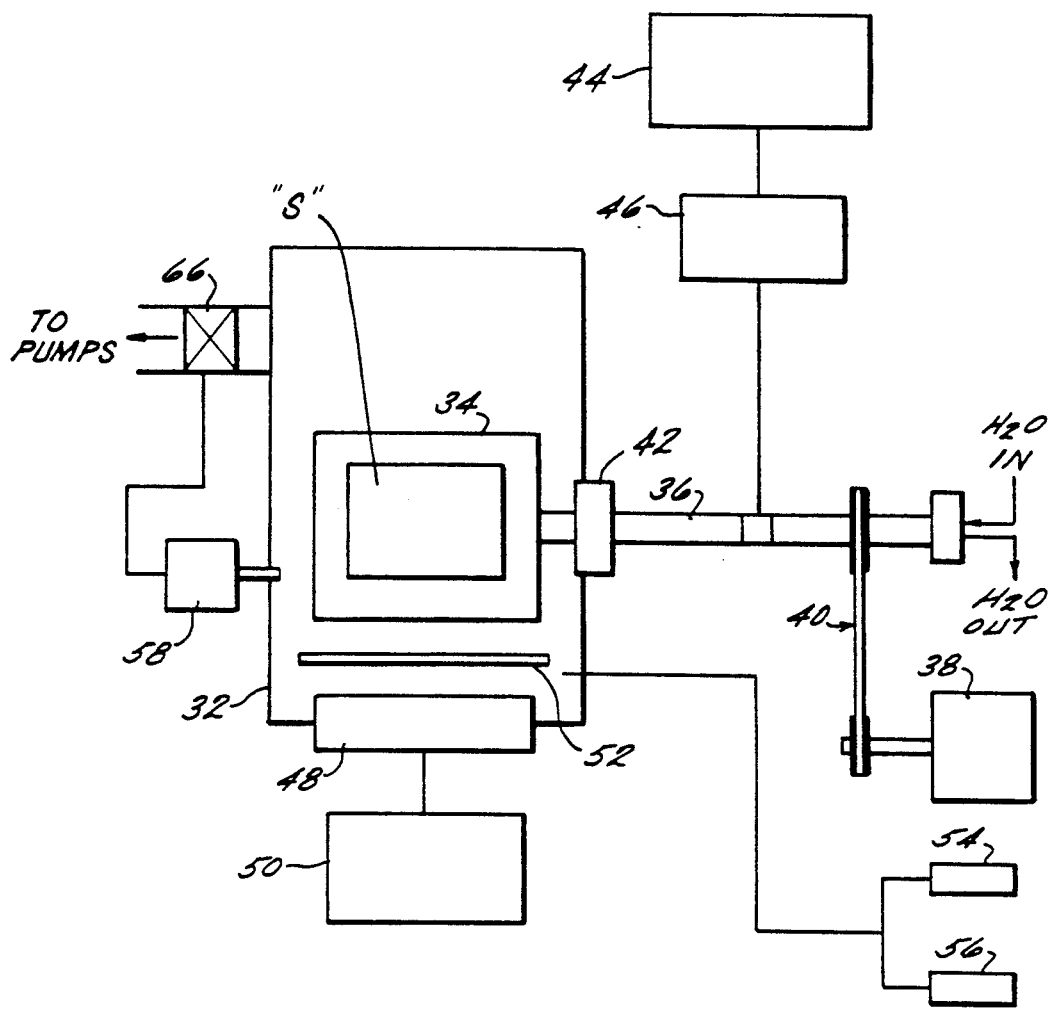
FIG. 35 shows the details of apparatus used for seed layer sputter coating in the process of the present invention.

The application of seed layer 30 is an important part of the process of the present invention. The apparatus for accomplishing the sputtering is shown in FIG. 35. The apparatus includes a vacuum chamber 32 in which a deposition drum 34 is rotatably mounted. Drum 34 is internally water cooled. The shaft 36 of drum 34 extends through the side of chamber 32 and is connected to a variable speed drive motor 38 which drives shaft 36 by a belt and pulley arrangement 40 to rotate drum 34 within chamber 32. Shaft 36 passes through the wall of chamber 32 through an electrically isolated rotary feedthru 42. Externally of chamber 32, shaft 36 is connected to a 13.56 MHz RF power supply 44 through an automatic matching network 46. A planar magnetron sputtering cathode 48 with a copper target is mounted in the bottom of chamber 32, with the distance from cathode 48 to drum 34 being about 10 cm. Cathode 48 is connected to and powered by a DC power supply 50. A moveable shutter 52 is mounted between cathode 48 and drum 34 to allow for pre-sputtering of the copper target. Argon process gas is metered into the system via mass flow controllers 54, 56, respectively; and the gas is introduced close to the sputtering cathode 48. Vacuum chamber 32 is pumped with a diffusion/mechanical Pump combination (not shown) through a throttle valve 60 controlled by a capacitance manometer 58. The system is capable of reaching a base pressure of less than $1 \times 10 \text{ E}^{-6}$ torr. The MCM substrate subassembly "S" to be sputter coated (the subassembly of FIG. 6) is mechanically fastened to the face of drum 34 by any suitable means. The system is then pumped down to a pressure less than $5 \times 10 \text{E}^{-5}$ torr, and then argon is flowed through chamber 32 at a rate such that the chamber pressure is maintained at $3 \times 10 \text{E}^{-3}$ torr. RF power at 300 watts is then applied to the drum rotating at 4 rpm, and the MCM substrate subassembly is sputter etched for about fifteen minutes. DC self-bias on the drum during this part of the sputter etch is approximately $-175$ volts. During the last minute of the sputter etch, the sputtering cathode is ramped to 2.5 kw with the shutter closed. After the sputter etch and the one minute ramp, shutter 52 is opened and the bias power is reduced to 175 watts. Copper is biased sputtered under these conditions for 4 minutes to deposit about 1000 angstroms of copper. After the 4 minutes of biased sputtering deposition, the RF power is turned off and the sputtering is continued for 13 minutes, thereby resulting in a total sputtered copper thickness seed layer 30 of approximately 5000 angstroms. Chamber 32 is then vented to atmosphere, and the subassembly "S" is removed from the drum. Subassembly "S" is now ready for additional copper plating on seed layer 30.

It will, of course, be understood that more than one subassembly "S" can be sputter coated at the same time, depending on the dimensions of drum 34 and the subassemblies "S".

The seed layer sputter deposition process eliminates the need for a chemical etch of the fluoropolymer. The process has the advantage that it is a completely dry process; eliminates the waste disposal problems usually associated with chemical etches and electroless copper deposition, and it eliminates the need for wet plating baths. The seed layer sputter deposition process provides very good adhesion to both the fluoropolymer and metal (copper) deposited in subsequent processing of the subassembly. The seed layer/fluoropolymer interface and the interface of the seed layer with subsequently electrodeposited copper are both stable to humidity, thus solving a major problem encountered in the prior art. The apparatus and method for seed coat sputtering are set out in full detail in copending U.S. application Ser. No. 799,447, filed Nov. 27, 1991 and assigned to Rogers Corporation, the assignee hereof, said application being fully incorporated herein by reference.

After removing the MCM substrate subassembly from the seed coating chamber, a layer of photoresist 62 is applied to seed layer 30. The photoresist 62 is then imaged and developed to expose parts of seed layer 30 to define (a) sites 64 for "y" direction lead lines and (b) via sites 16a and 18a above the vias 20(a) and 22(a) to continue building the vias if desired. The step of defining the "y" direction lead line sites and the via continuation sites is indicated at step H of FIG. 36 and is shown in FIG. 8.

Next, copper is electroplated on the exposed parts of seed layer 30 in sites 16a, 18a and 64. The plating at sites 64 forms "y" direction lead lines 67; the plating at sites 16a, 18a forms continuations 20(b) of the ground vias and continuations 22(b) of the thermal vias. The plating is controlled so that the height of the copper deposited in these sites is equal to or less than the thickness of photoresist 62. Again, care must be taken to make sure that the electroplated copper at these sites does not mushroom over above the surface of photoresist 62. See FIG. 9 and step I of FIG. 36.

Figure 10:
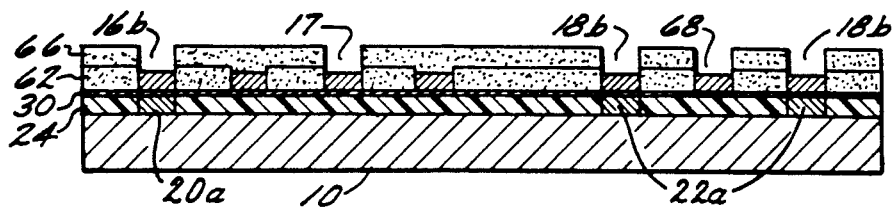
Figure 11:
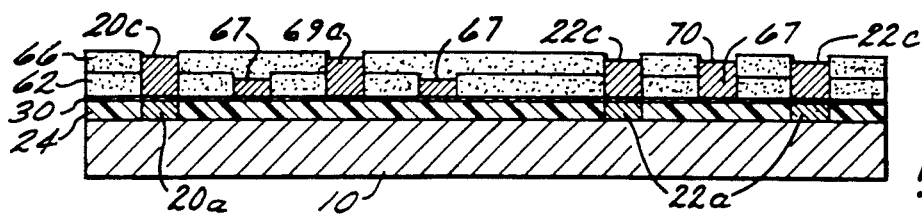

With photoresist layer 62 still in place, another layer of photoresist 66 is applied over photoresist layer 62; and layer 66 is imaged and developed to define site 16b and 18b for continuation of the ground vias 20 and thermal vias 22, respectively, "y" lead line via site 17 for formation of a via from a "y" lead line to the top of the MCM substrate for ultimate connection to an I/C and blind via site 68 for formation of a blind via which will eventually be contained wholly within the MCM substrate assembly to connect a "y" direction lead line to an "x" direction lead line (which will be formed in subsequent steps). The step of defining these via sites is indicated at step J of FIG. 36 and is shown at FIG. 10.

Next, copper is electroplated in via sites 16b, 18b, 17 and 68 to form continuations 20(c) and 22(c), respectively, of ground and thermal vias 20 and 22, to form "y" via segment 69(a) and to form blind via 70. Again, the plating is controlled so that the height of the copper deposited in these sites is equal to or just slightly less than the height of photoresist 66 to make sure that the electroplated copper at these sites does not mushroom over the surface of photoresist. See FIG. 11 and step K of FIG. 36. Note in FIG. 11, that some of the "y" lines 67 are covered by resist 66 and are not connected to a blind via 70. The blind via(s) 70 is formed only at those "y" line sites where called for in the design of the MCM substrate structure.

Figure 12:
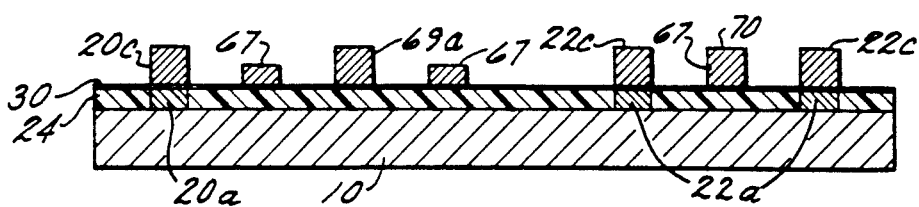

Next, the two exposed photoresist layers 66 and 62 are removed to leave the subassembly structure shown in FIG. 12 where the ground and thermal vias 20 and 22, the "y" via 69 and the blind via(s) 70 are exposed. Note, also, that portions of seed layer 30 remain in the subassembly at this point and are exposed, while the vias 20 (made up of segments 20(a), 20(b) and 20(c) and part of the seed layer) and the vias 22 (made up of segments 20(a), 20(b) and 20(c) and part of the seed layer) and the vias 69 and 70 each form effectively continuous solid posts. Note, also, that the width of "y" via 69 and blind via 70 are the same as the width of "y" lead line 66. There are no enlarged pads at any junction points. The assembly is subjected to a flash etch to remove the exposed portions of seed layer 30. The seed layer is so thin that the etching and time required to remove it does not have any appreciable effect on other exposed copper parts, e.g., vias and lead lines, so there is no need to protect them during this etch step. The removal of the two resist layers and the flash etching are shown at step L of FIG. 36.

Figure 13:
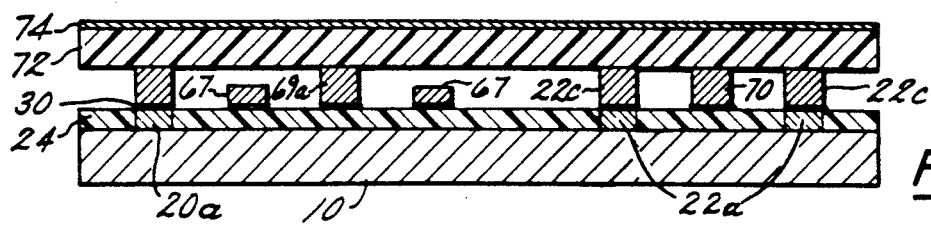

Following the flash etch, a layer of R02800 fluoropolymer 72 with an upper release layer backing 74 is placed on top of the vias (see FIG. 13 which shows the subassembly after flash etching of seed layer 30). The fluoropolymer/copper layer is the same as layer 24, 26 (see FIG. 5), with the thickness of fluoropolymer layer 72 being sufficient to cover over the vias after lamination. The fluoropolymer layer 72 is then laminated to the assembly by a repeat of the heat and lamination process described above in detail with respect to step E. As previously discussed, the lamination process densifies the fluoropolymer layer 72 in the z direction, but the material does not flow laterally (x or y directions), so the positioning and alignment of the vias and lead lines is not disturbed in the lamination step. However, as distinguished from step E, the fluoropolymer layer 72 now bonds to and fuses with fluoropolymer layer 24 to form a unified body of fluoropolymer material 72, 24 in the MCM substrate subassembly. The copper release layer 74 is then removed by etching. Placing the fluoropolymer layer 72 and laminating it are shown at step M of FIG. 36.

Figure 14:
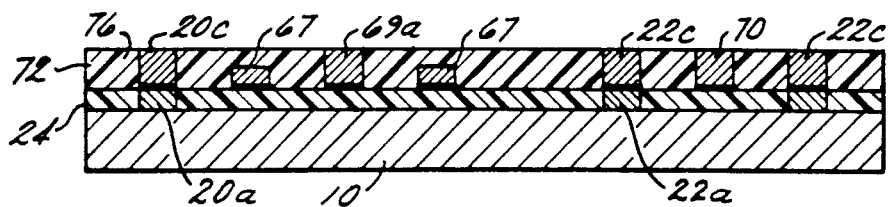

Next, the upper surface of the subassembly is planarized by flycutting in a repeat of the process described above with respect to step F to (a) ensure planarity (i.e., parallelism) with the upper surface 12 of platform 10, and (b) to provide an upper surface 76 of the subassembly where the via segments 20 and 22 and 69 and 70 are exposed and are coplanar with each other and with the exposed upper surface 76 of fluoropolymer layer 72. The planarizing step is indicated at step N in FIG. 36, and the planarized unit is shown in FIG. 14.

Figure 15:
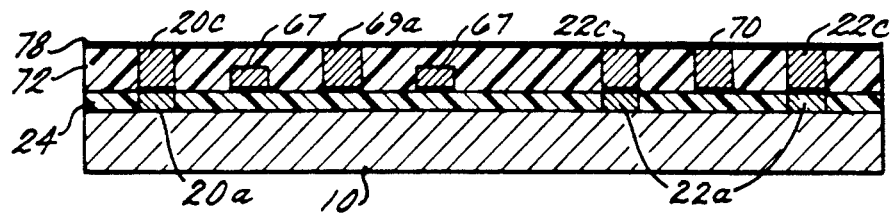

After this second planarizing/flycutting operation, another seed layer of copper 78, like layer 30, is sputter coated on planarized surface 76 to provide a seed layer of copper on both the fluoropolymer and the vias for further electroplating. This second seed layer 78 is formed by the same process discussed above with respect to step G and the formation of seed layer 30. The subassembly with the second seed layer is shown in FIG. 15 and indicated at step O in FIG. 36.

A layer of photoresist 80 is then applied to seed layer 78; and the photoresist 80 is imaged and developed to expose parts of seed layer 80 to define (a) sites 82 for "x" direction lead lines and (b) via sites 16c, 18c and 17a to continue vias 20, 22 and 69 (see FIGS. 16 and 16a, which is a partial top plan view of FIG. 16). Note that the via sites for ground vias 20 and thermal vias 22 do not intersect any "x" or "y" lines; but that blind or buried via 70 is located at an intersection of an x line site 82 and "y" line 67(a). The step of defining the "x" direction lead line sites 8 and the via continuation sites is indicated at step P of FIG. 36.

Next, copper is electroplated on the exposed parts of seed layer 78 in sites 16c, 18c, 17a and 82 to form via extensions 20(d), 22(d) and 69b, and "x" direction lead lines 84. Again, the plating is controlled so that the height of the copper deposited in these sites is equal to or just slightly less than the thickness of photoresist 80, with care being taken to make sure that the electroplated copper at those sites does not mushroom over the surface of photoresist 62. See step Q of FIG. 36 and FIGS. 17 and 17(a). Note that at this point blind via 70 interconnects "y" lead line 67(a) to "x" lead line 84(a).

Figure 18A:
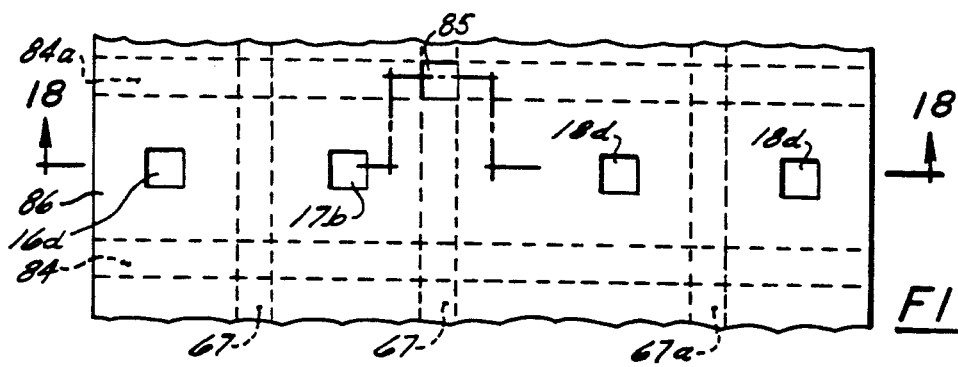
Figure 19:
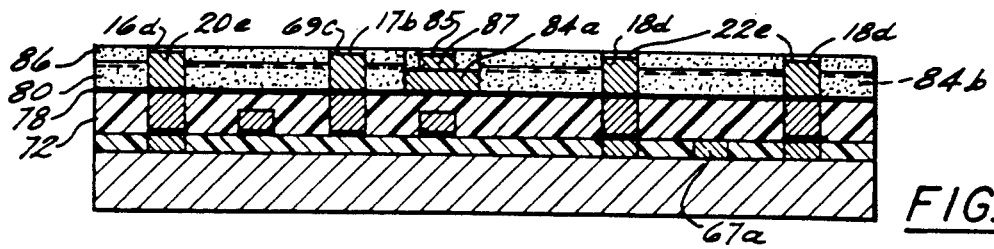

With photoresist layer 80 still in place, another layer of photoresist 86 is applied; and photoresist layer 86 is imaged and developed to define sites 16d and 18d for continuation of the ground vias 20 and thermal vias 22, respectively and the site 17b for continuation of "y" lead line via 69. A new via site 85 is also defined in photoresist layer 86 directly above an "x" direction signal line (e.g., 84(a), part of which is shown in cross section in FIG. 18 for purposes of illustration) to begin to build a via from an "x" direction signal line to the surface of the MCM substrate. The step of defining these sites is indicated at step R of FIG. 36 and is shown in FIGS. 18 and 18(a).

Next, copper is plated in sites 16d, 18d, 17b and 85 to form continuations 20(e) and 22(e) of ground and thermal vias 20 and 22, respectively, and continuation 69c of "y" line via 69 and via segment 87 for an "x" line via. Again, the plating is controlled so that the height of the copper deposited in these sites is equal to or just slightly less than the height of photoresist 86 to make sure that the electroplated copper at these sites does not mushroom over the surface of the photoresist. See FIG. 19 and step S of FIG. 36.

Figure 20:
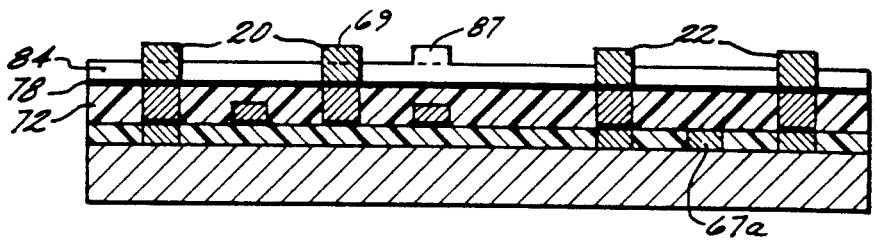

Next, the two exposed photoresist layers 86 and 80 are removed to leave the subassembly structure shown in FIG. 20 where the ground and thermal vias 20 and 22, respectively, "y" line via 69, the "x" direction lead lines 84 and x line via 87 are exposed. Note, also, that exposed portions of seed layer 78 remain in the subassembly at this point, while the via 20 (now made up of segments 20(a)-(d) and parts of seed layers 78 and 30) and the vias 22 (now made up of segments 20(a)-(d) and parts of seed layers 78 and 30) and the via 69 (now made up of segments 69a-c and parts of seed layer 78 and 30) and the via 87 form, effectively, continuous solid posts. Again, and still, there are no contact pads in the subassembly. The subassembly is then subjected to a flash etch to remove the exposed portions of seed layer 78. As with seed layer 30, seed layer 78 is so thin that the time and etching required to remove it does not have any appreciable effect on the other exposed copper parts, e.g., vias and lead lines, so there is no need to protect them during this flash etch step; but those other exposed parts can, if desired, be protected, as by photoresist which would be applied before and removed after this flash etch. The removal of the two resist layers and the flash etch are shown at step T of FIG. 36.

Figure 21:
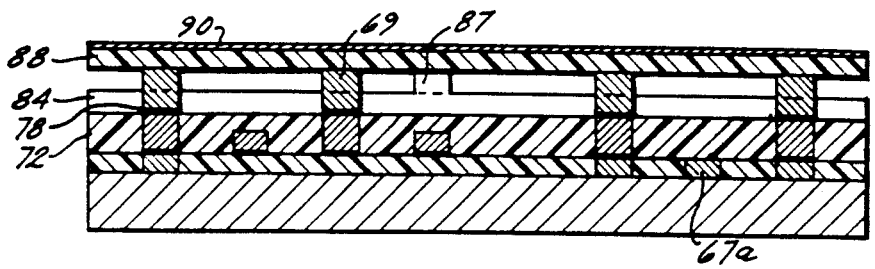

Following the flash etch, another layer of R02800 fluoropolymer 88 with an upper release layer backing 90 is placed on top of the vias (see FIG. 21, which shows the subassembly after flash etching of seed layer 78). This fluoropolymer/copper layer is the same as layers 24, 26 and layers 72, 74, with the thickness of fluoropolymer layer 88 being sufficient to cover over the vias after lamination. The fluoropolymer layer 88 is then laminated to the assembly by a repeat of the heat and pressure process described above in detail with respect to step E (with the exception that the lamination pressure in steps (c), (d) and (e) is lowered to 500 p.s.i.). As previously discussed, the lamination process densifies the fluoropolymer layer 88 in the z direction, but the material does not flow laterally (x or y directions), so the positioning and alignment of the vias and lead lines is not disturbed by the lamination step. However, as distinguished from step E, fluoropolymer layer 88 now bonds to and fuses with fluoropolymer layer 72 to form a unified body of fluoropolymer 88, 72, 24 in the MCM substrate assembly. The copper release layer 90 is then removed by etching. Placing the fluoropolymer layer 88 and laminating it are shown at step U of FIG. 36.

Figure 22:
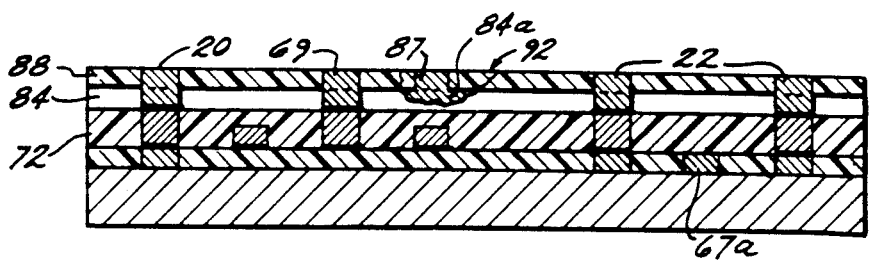

Next, the copper and dielectric surface of the subassembly is planarized by flycutting in a repeat of the process described above with respect to step F to (a) ensure planarity (i.e., parallelism with the upper surface 12 of platform 10), and (b) to provide an upper surface 92 of the subassembly where the via segments 20, 22, 69 and 87 are exposed and are coplanar with each other and with the exposed upper surface 92 of fluoropolymer layer 88. The planarizing step is indicated at step V in FIG. 36, and the planarized unit is shown in FIG. 22.

Figure 23:
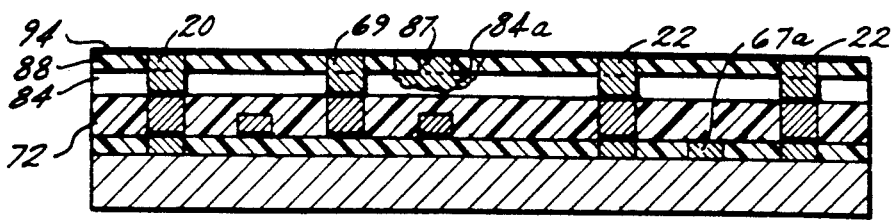

After this third planarizing/flycutting operation, another seed layer of copper, like layers 30 and 78 is sputter coated on planarized surface 92 to provide a seed layer of copper on both the fluoropolymer and the vias for further electroplating. This third seed layer 94 is formed by the same process discussed above with respect to step G and the formation of seed layer 30. The subassembly with the third seed layer is shown in FIG. 23 and is indicated at step W of FIG. 36.

Figure 24:
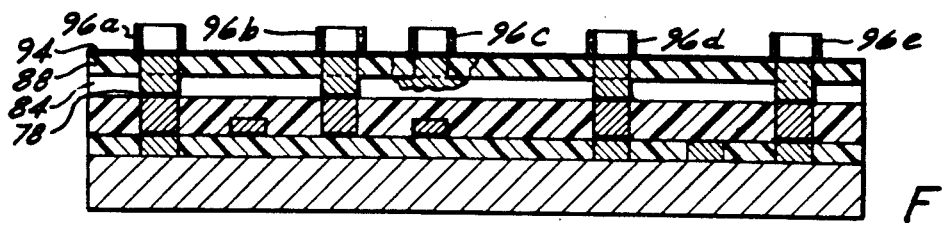
Figure 24A:
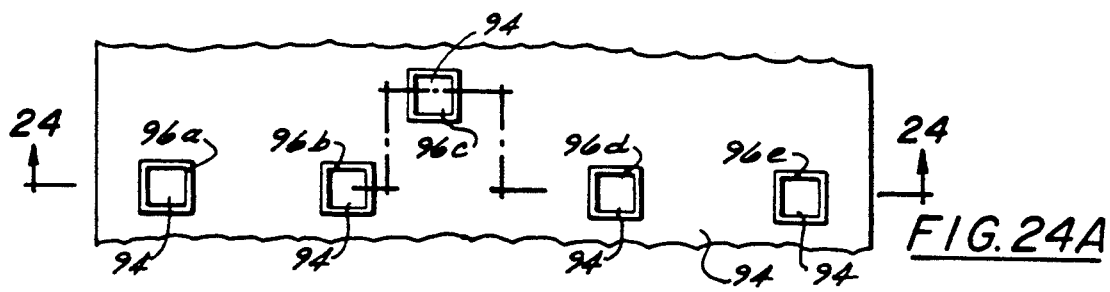
Figure 25:
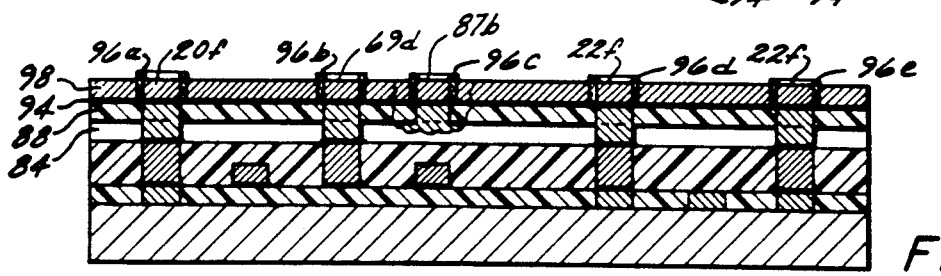
Figure 26:
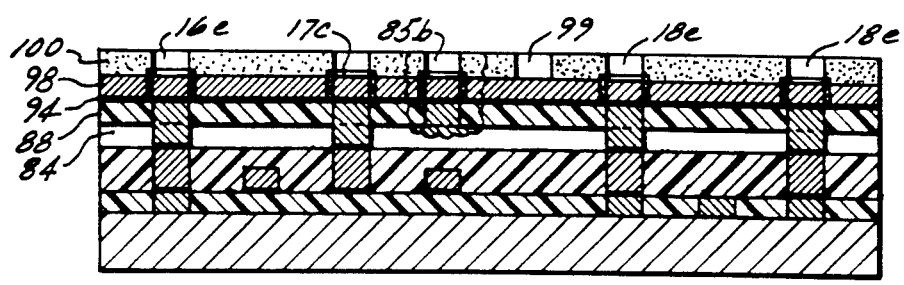
Figure 27:
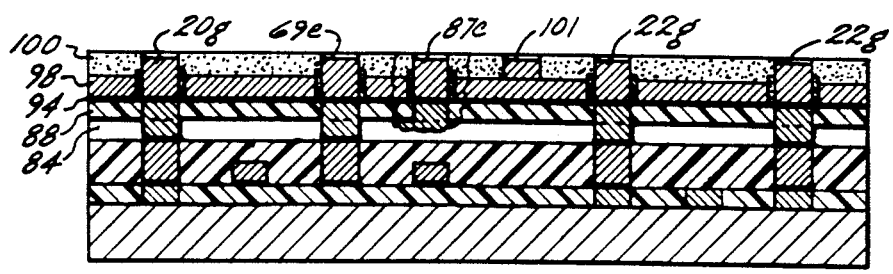

The MCM substrate subassembly is now at a state in its development where a power or voltage plane is to be formed. To that end, a layer of photoresist is next applied to seed layer 94; and the photoresist is imaged and developed to define the voltage plane and simultaneously to provide openings in the formed voltage plane for passage of vias. These openings (defining sites of Photoresist) are indicated at 96(a)-(e) in FIGS. 24 and 24(a). It will be understood that the resist left in place in this instance is in the form of rectangular frames, with the resist having been removed from the rest of the surface of the subassembly to expose the seed layer 94. The step of defining the via passage sites is indicated at step X in FIG. 36.

Next, copper is electroplated on the exposed surface of seed layer 94 to form a power or voltage plane 98; and it will be understood the voltage plane 98 covers all of the upper surface of the MCM substrate assembly except those parts under copper will be plated within the frames 96(a)-(e) to form continuation 20(f) and 22(f) of the ground and thermal vias 20, 22 and continuations 69(d) and 87(b) of the 'y' and 'x' signal line vias, respectively. See FIG. 25 and step Y of FIG. 36. Once again, the plating is controlled so that the height of the copper deposited in this electroplating step is equal to or just slightly less than the thickness of resist 96, with care being taken to make sure that the electroplated copper does not mushroom over the surfaces of resist frames 96.

With photoresist frames 96 still in place, another layer of photoresist 100 is applied, and photoresist layer 100 is imaged, developed and washed away to expose via sites 16e and 18e for continuation of the ground and thermal vias and sites 17c and 85b for continuation of the y and x signal line vias. A new via site 99 is also formed in photoresist layer 100 to define a site for formation of a via to extend from the voltage plane to the top of the MCM substrate device. See FIG. 26 and step Z of FIG. 36.

Next, copper is electroplated in sites 16(e), 18(e), 17(c) and 85(b) to form via extensions 20(g), 22(g), 69(e) and 87(c) and to form voltage plane via 101. Again, the plating is controlled so that the height of copper deposited in these sites is equal to or just slightly less than the height of photoresist 100, with care being taken to make sure that the electroplated copper deposited at these sites does not mushroom over the surface of photoresist 100. See step AA of FIG. 36 and FIG. 27.

Figure 28:
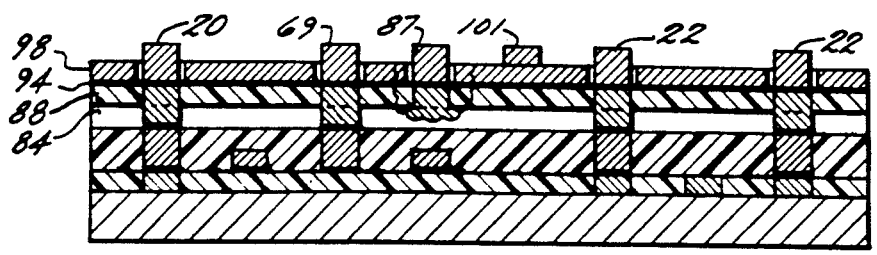
Figure 29:
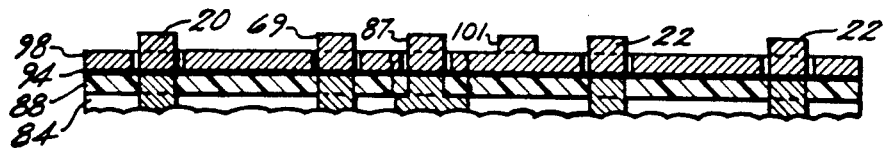
Figure 30:
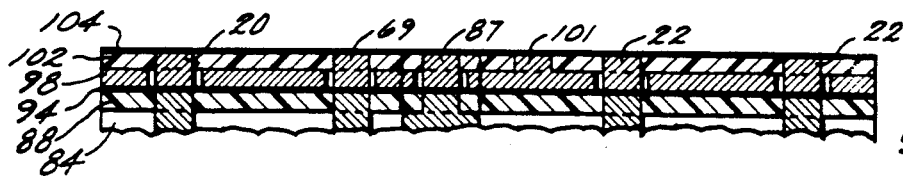

Next, the exposed photoresist layer 100 and the photoresist frames 96(a)–96(e) are removed to leave the subassembly shown in FIG. 28 where the voltage plane 98, ground via 20, thermal via 22, y signal line via 69, x signal via 87 and voltage via 101 are all exposed. Note, here, that those areas of seed layer 94 which were previously covered by the Photoresist frames 96 are also exposed, but all other parts of seed layer 94 are covered by voltage plane 98. The subassembly is then subjected to a flash etch to remove the exposed portions of seed layer 94 (see FIG. 29). As with seed layer 30, seed layer 94 is so thin that the time and etching required to remove it does not have appreciable affect on the other exposed copper parts, i.e., the vias and the voltage plane, so there is no need to protect them during this flash etch step; but those other exposed parts can, if desired, be protected by photoresist which would be applied before and removed after this flash etch step. By removing the exposed parts of seed layer 94, this flash etch step electrically isolates all of the vias (except via 101) from the voltage layer 98, whereby via 101 is electrically connected to voltage plane 98, but the several other vias pass through but are electrically isolated from the voltage layer. The removal of the resist and the flash etch are shown at step BB of FIG. 36.

Figure 31:
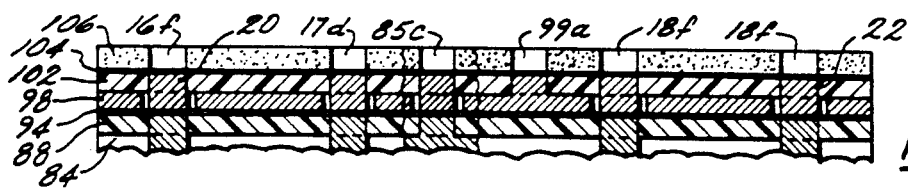
Figure 32:
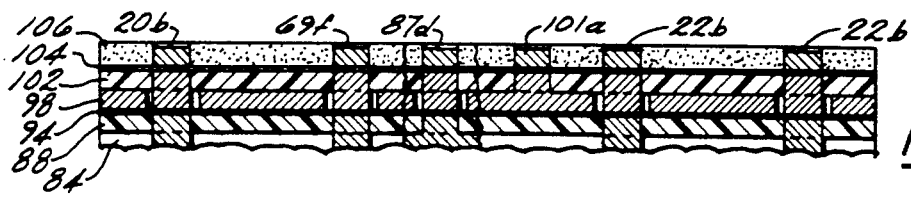
Figure 33:
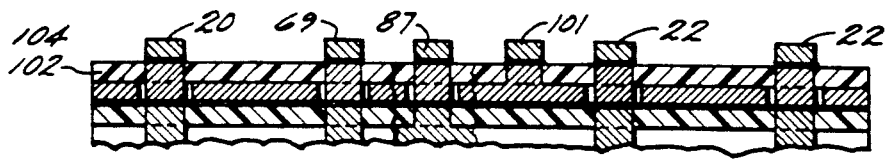
Figure 34:
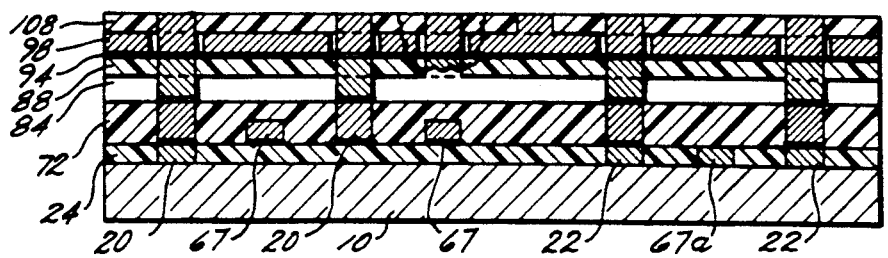

At this point, either another layer of fluoropolymer composite may be laminated to the assembly or a rigid top layer may be added. In the former case, steps E, F and G are repeated as at steps CC, DD and EE of FIG. 36 to laminate another layer of fluoropolymer 102 to the subassembly (step CC), to flycut to planarize (step DD), and to sputter coat to form a seed layer 104 (see step EE of FIG. 30). Then, a layer of photoresist 106 is applied, imaged and developed to define nickel/gold or solder pad sites 16(f), 18(f), 17(f), 85(c) and 99(a), as shown in FIG. 31 and indicated at step FF of FIG. 36. Nickel/gold or solder is then electroplated to form Pads 20(b), 22(b), 69(f), 87(d) and 101(a) for eventual connection to IC's or other electronic components. See FIG. 32 and step GG of FIG. 36. The photoresist 106 is then removed to leave the several pads; and the flash etch step is repeated to remove the exposed portions of seed layer 104. See FIG. 33 and step HH of FIG. 36.

Alternatively, where required (e.g., for wired bonding) a rigid top layer 108 is formed as the top layer of the MCM substrate assembly. See FIG. 34 and steps CC' to HH' of FIG. 36. Preferably layer 108 is a cyanate ester/silica coating (or another appropriately rigid filled polymeric resin) which is applied in liquid form and evenly spread by a knife edge doctor blade. Layer 108 is preferably comprised of a liquid dicyanate monomer (Aro-Cy L-10 from Rhone-Poulene) compounded with silica (preferably Harbison-Walker 10 micron cutoff). Preferably, 30 volume % silica filler is used so that the CTE of layer 108 closely matches the CTE of the underlying assembly. A catalyst is used to polymerize the dicyanate monomer in a concentration of 7.0 parts per hundred parts cyanate ester resin. The preferred catalyst is zinc stearate added 4.0 phr to nonylphenol. After curing of the cyanate ester/silica coating, the top layer is flycut to planarize the top surface of the MCM substrate assembly, i.e., to ensure parallelism between the top surface and surface 12 of platform 10. The seeding step EE' comprises conventional chrome/copper sputtering for improved adhesion.

The construction of the MCM substrate assembly is now complete. Several MCM substrate assemblies can be built at the same time on a single platform (e.g., platform 10); and the devices can be singulated at any time after manufacture for eventual use. In use, I/C's will be adhesively secured to the upper surface of an MCM substrate device and electrically connected (e.g., as by wire bonding) to various vias exposed at the top surface of the MCM substrate module. The particular layouts of vias and I/C's will, of course, depend on the application and design involved.

Figure 37:
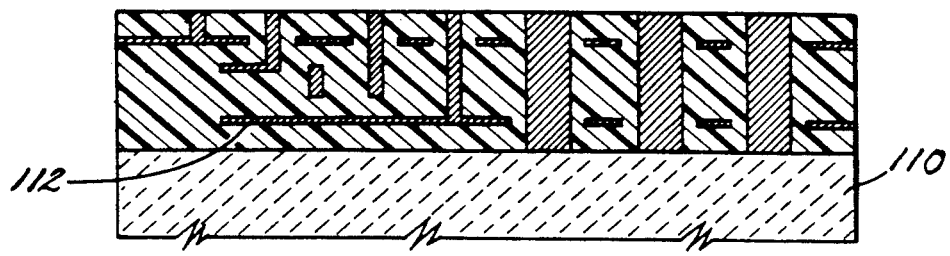
FIG. 37 is a view similar to FIG. 34 showing a second embodiment of the MCM substrate of the present invention.

Referring next to FIG. 37, a second embodiment of an MCM substrate built with the process of the present invention is shown. This second embodiment differs from the embodiment shown in FIG. 34 in that: (1) the base 110 is ceramic rather than being a copper platform; the device incorporates a ground plane 112 which would be built on a layer of RO2800 which was subjected to a sputter seeding (in this case comprising a conventional chrome/copper sputter seeding) step (analogous to step EE') and electrodeposition; and the thermal vias extend down to the ceramic platform 110 (which would also have been subjected to sputter seeding and photoresist imaging to define the sites on base 110 at which the thermal vias were to be grown). The remainder of the MCM substrate of FIG. 37 would be manufactured as described above in connection with the build-up of the device of the first embodiment.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A method of forming a multichip module substrate comprising the steps of:
    selecting a planar platform having opposed mutually parallel surfaces;
    forming first via sites on a first of said surfaces of said platform;
    plating in said via sites to form first vias in said via sites to define a first subassembly;
    laminating a first sheet of filled fluoropolymeric composite material onto said first subassembly to define a laminated first subassembly;
    planarizing said laminated first subassembly to expose selected ones of said first vias and to define a first planarized surface;
    depositing a first thin metallized seed layer on said first planarized surface;
    forming "y" circuit line sites and second via sites on said first seed layer;
    plating "y" circuit lines and second vias in said "y" circuit line sites and said second via sites, respectively;
    selectively flash etching said first seed layer to define a second subassembly;
    laminating a second sheet of filled fluoropolymeric composite material onto said second subassembly;
    planarizing said laminated second subassembly to expose selected ones of said second vias and define a second planarized surface;
    depositing a second thin metallized seed layer on said second planarized surface;
    forming "x" circuit line sites and third via sites on said second seed layer;

plating "x" circuit lines and third vias in said "x" circuit line sites and said third via sites, respectively;

selectively flash etching said second seed layer to define a third subassembly;

laminating a third sheet of filled fluoropolymeric composite material onto said third subassembly;

planarizing said laminated third subassembly to expose selected ones of said third vias and define a third planarized surface;

depositing a third thin metallized seed layer on said third planarized surface;

forming voltage plane sites and fourth via sites on said third seed layer;

plating a voltage plane on said third seed layer and plating fourth vias in said fourth via sites;

selectively flash etching said third seed layer to define a fourth subassembly;

providing a cover layer on said fourth subassembly;

planarizing said covered fourth subassembly to expose selected ones of said fourth vias on a fourth planarized surface;

depositing a fourth thin metallized seed layer on said fourth planarized surface;

forming pad sites on said fourth seed layer;

plating pads in said pad sites; and selectively flash etching said fourth seed layer.

2. The method of claim 1 wherein:
said planar platform defines a ground plane.

3. The method of claim 1 wherein said steps of forming said first, second, third and fourth via sites and said steps of forming said "x" and "y" circuit line sites include the steps of:
selectively depositing photoresist material;
imaging said deposited photoresist material; and
developing said imaged photoresist material to define said sites.

4. The method of claim 3 including the step of:
removing any undeveloped photoresist material between the plating steps and the flash etching steps.

5. The method of claim 3 wherein said steps of plating said first, second, third and fourth vias includes the step of:
controlling the height of the vias to be equal to or less than the height of the photoresist.

6. The method of claim 1 wherein each of said sheets of filled fluoropolymeric composite material includes a thin release layer on a top surface thereof.

7. The method of claim 1 wherein said filled fluoropolymeric composite material comprises:
silane coated, silica filled polytetrafluoroethylene.

8. The method of claim 1 wherein said laminating steps comprise:
(a) at a low pressure, ramping of the laminating temperature up to about 700° F.;
(b) increasing the pressure to 500 to 1700 p.s.i.;
(c) soaking at about 700° F. and 500 to 1700 p.s.i.;
(d) reducing the temperature to about 400° F. while maintaining a pressure of 500 to 1700 p.s.i.;
(e) reducing the pressure to about 100 p.s.i. while maintaining the temperature of 400° F.;
(f) cooling to below 100° F. at a pressure of about 100 p.s.i.

9. The method of claim 1 wherein said steps of planarizing comprise:
a flycutting process.

10. The method of claim 9 wherein:
said flycutting process utilizes a diamond cutting tool operated at a positive rake angle.

11. The method of claim 8 wherein:
said positive rake angle is about 4°.

12. The method of claim 1 wherein said steps of depositing seed layers comprise:
sputter coating in an argon gas.

13. The method of claim 1 wherein said cover layer comprises:
a fourth sheet of filled fluoropolymeric composite material.

14. The method of claim 1 wherein said cover layer comprises:
a filled cyanate ester resin.

15. The method of claim 1 wherein said pads comprise:
nickel/gold or solder plating.

16. The method of claim 1 wherein:
said vias define solid copper plugs.

17. The method of claim 1 wherein:
at least some of said vias define blind vias.

18. The method of claim 1 wherein:
at least some of said fourth vias extend through, but are electrically isolated from said voltage plane.

19. The method of claim 1 wherein:
selected first and second vias are vertically aligned and are electrically and mechanically connected.

20. The method of claim 1 wherein:
selected first, second and third vias are vertically aligned and are electrically and mechanically connected.

21. The method of claim 1 wherein:
selected first, second, third and fourth vias are vertically aligned and are electrically and mechanically connected.

* * * * *